United States Patent [19]
Munroe

[11] Patent Number: 5,132,656
[45] Date of Patent: Jul. 21, 1992

[54] FLOATING-GATE CHARGE-BALANCE CCD

[75] Inventor: Scott C. Munroe, Carlisle, Mass.

[73] Assignee: Massachusetts Institute of Technology, Cambridge, Mass.

[21] Appl. No.: 711,115

[22] Filed: Jun. 4, 1991

Related U.S. Application Data

[63] Continuation of Ser. No. 346,744, May 3, 1989, abandoned.

[51] Int. Cl.$^5$ .................. G11C 19/28; H01L 29/78
[52] U.S. Cl. ............................... 377/60; 357/24
[58] Field of Search .................. 357/24; 377/57–63

[56] References Cited

U.S. PATENT DOCUMENTS

| | | | |
|---|---|---|---|
| 3,986,198 | 10/1976 | Kosonocky | 357/24 |
| 4,040,077 | 8/1977 | Tehon | 357/24 |
| 4,476,568 | 10/1984 | Prince | 377/60 |
| 4,486,893 | 12/1984 | Carrison | 377/60 |

Primary Examiner—Gene M. Munson
Attorney, Agent, or Firm—Matthew E. Connors

[57] ABSTRACT

A charge-coupled device having a charge source and a floating gate input capable of sampling a voltage and converting it to a proportional charge packet, including precharging the floating gate with a quantity of charge proportional to the sampled voltage, and isolating the floating gate such that the proportional charge substantially remains on the floating gate, and a method for doing same.

31 Claims, 6 Drawing Sheets

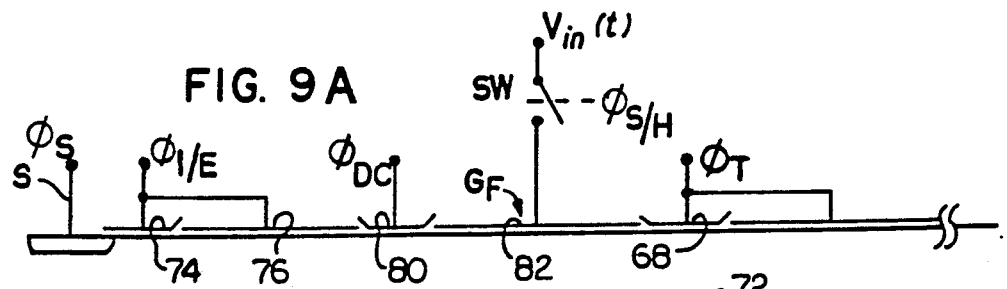
FIG. 9A
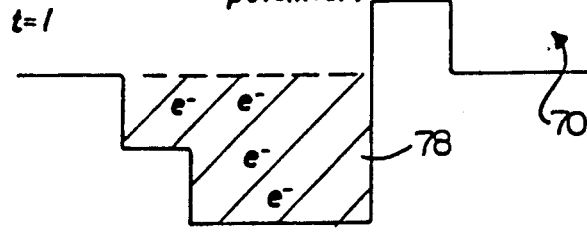
FIG. 9B
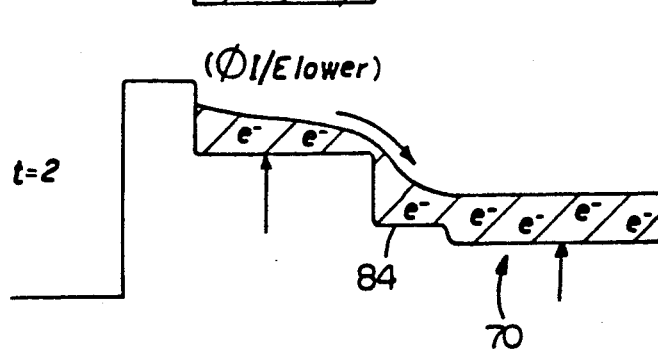
FIG. 9C
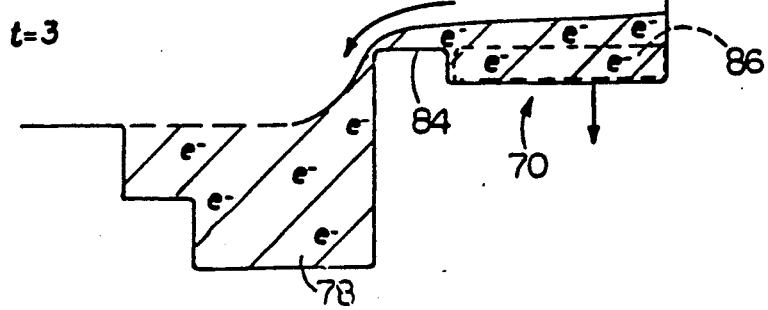
FIG. 9D ($\phi_{I/E}$ higher)

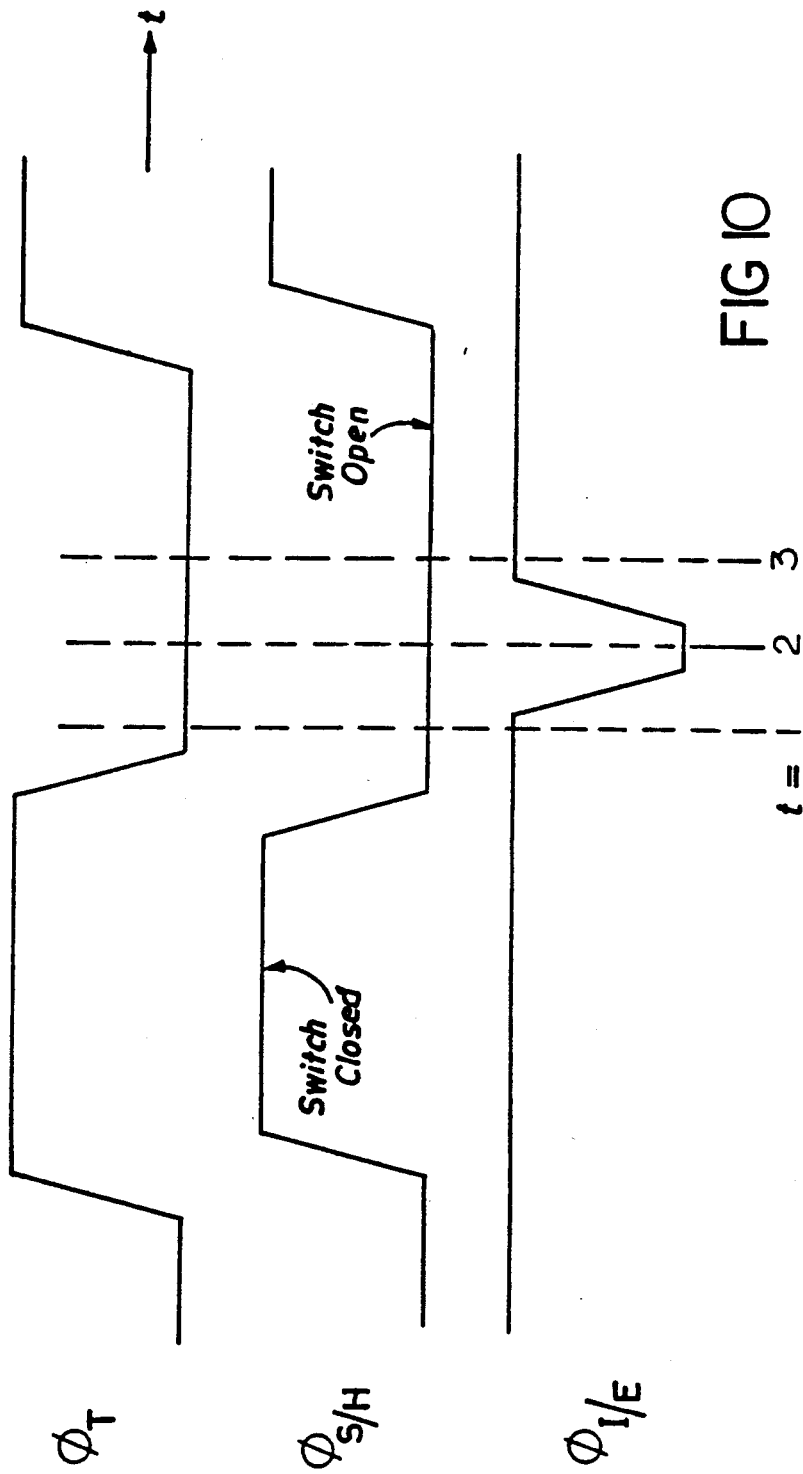

FLOATING-GATE CHARGE-BALANCE CCD

The U.S. Government has non-exclusive rights in this invention pursuant to contract number F19628-85-C-0002 awarded by the Department of the Air Force.

This is a continuation of copending Ser. No. 07/346,744 filed on May 3, 1989, now abandoned.

This invention relates to signal sampling and storage in charge-coupled devices.

There presently is a demand in the field of electronic signal processing for improved signal sampling devices capable of accurately and reliably sampling of either digital or analog input signals and for memory units which store larger amounts of data in smaller physical space at lower cost.

One promising method for these purposes is the use of charge-coupled devices (CCDs). In this technology, a series of metal gates are formed over a thin insulating dielectric which itself is layered upon a semiconductor substrate. For storage applications, using, for example, an n-type silicon semiconductor, a gate which is pulsed negative creates a region of low potential (or a "potential well") beneath the gate. This well attracts positive charges. Typically, a source of charges is provided, such as a region of highly p-doped silicon, which provides positive charges adjacent to the CCD gate. The electric field at the gate effectively forms a region of low potential energy or a potential well for the charge (also called a "charge packet"). Upon returning the gate to zero voltage, the charge packet is dispersed or effectively "dumped." Other gates in the device, however, may be pulsed negative, and the dumped charge packets thereby attracted under them. With the addition of amplifiers for detecting the charge packets and representing digital one or zero by the presence or absence of a charge packet, useful circuits such as digital shift registers may be formed, for example.

Similarly, CCDs have applications in signal sampling. In a p-type semiconductor, for example, a varying voltage signal may be made to influence the amount of negative charge under a gate. The quantity of charge in a packet can now represent, and is preferably proportional to, the amplitude of the sample of the original signal, and can be made available for further processing in a CCD shift register, for example.

Two techniques for sampling an input voltage and converting it into a proportional charge packet presently in common use are the potential equilibration (or "fill and spill") method and the diode cutoff method.

Fill and spill requires that a signal charge-storage well be overfilled with charge and then the excess be spilled back to the source. The charge remaining in the well is ideally proportional to the difference between the signal voltage controlling the storage well and a reference voltage. However, the resulting amount of charge in the well is different depending on whether the signal is increasing or decreasing the well depth, i.e., whether the signal is positive or negative going. Also, in order to handle bipolar input signals, the gate controlling the input well must be biased at an operating point different from the fixed reference voltage which controls the potential depth between the source and the well. This zero operating point is process dependent and thus individual adjustment of each chip is necessary.

The second common CCD input technique, diode cutoff, operates by initially making available to the signal storage well a virtually unlimited supply of charge at a fixed source potential. The amount of charge in the storage well is then proportional to the difference between the fixed source potential and the signal voltage on the signal gate electrode. To effect sampling, the signal well is rapidly disconnected or cut off from the source of a charge by applying voltage step to a control gate ("knife edge") placed between the signal well and source of charge. The optimum potential for the charge source is process dependent and must therefore be adjusted on a chip-to-chip basis.

SUMMARY OF THE INVENTION

One aspect of the present invention includes, in a charge-coupled device having a charge source and a floating gate input, a method of sampling a voltage and converting it to a proportional charge packet. The method includes precharging the floating gate with a quantity of charge proportional to the sampled voltage, and isolating the floating gate such that the proportional charge substantially remains on the floating gate.

The method may also include, variously, the step of establishing an empty potential well beneath the floating gate and raising the source to a potential higher than the well potential to cause charge from the source to form as a charge packet in the well; the step of lowering the source potential to extract some charge from the well and allowing an equilibration process to occur between the charge associated with the source and the charge associated with the well such that the remaining charge in the well is proportional to the charge on the floating gate; and the step of moving the remaining charge to a shift register. Preferably the ratio of the remaining charge in the well to the charge on the floating gate is 1:2.

In another aspect of the invention, a method for sampling a voltage signal and converting it into the form of a charge packet in a device having at least one gate, such as an MOS CCD, includes the steps of: providing a variable potential source of charge in electrical communication with the device, establishing an empty potential well beneath the at least one gate, connecting the voltage signal to the at least one gate and thereby establishing a potential thereon and influencing the depth of the well therebeneath, disconnecting the voltage signal and thereby isolating the at least one gate, pulsing the potential of the source to allow charge to temporarily flow into the well, and returning excess charge to the source during which the gate potential and well depth are influenced, the remaining charge in the well thereafter being representative of the sampled voltage. The method also may include, variously, the step of moving the remaining charge to a shift register; the step of providing a empty well under the floating gate at time $t=1$, applying a relatively high voltage to a charge injection and extraction control gate, and flooding a well under the charge injection and extraction control gate, at time $t=2$, pulsing the charge injection and extraction control gate low such that the charge in the well under the charge injection and control gate are transferred to the empty floating gate well, and at time $t=3$, pulsing the charge injection and extraction control gate high and extracting excess charge from the floating gate well.

Another aspect of the invention includes a charge-coupled device, such as an MOS CCD, having a circuit for sampling an input voltage, the circuit including a floating gate, a source of charges, and a structure responsive to a voltage from the floating gate and capable of generating a charge packet proportional to the sampled voltage, the structure capable of availing the charge packet to a desired location in the device. The device may also include a first phase comprising a barrier electrode and a first storage electrode, and a second phase, the first phase being for charge injection and extraction and the second phase being for charge transfer. The barrier electrode and the storage electrode form a charge injection and extraction electrode pair. Preferably one of the pair is comprised of polysilicon 1 and the other of polysilicon 2.

The device may also include a p-type substrate, an n-type charge source, an n-type charge drain, and an n-type layer in the substrate, with a buried channel defined therein, the n-type layer interposed between the source and drain, and at least the floating gate defined over the channel. Preferably several gates are defined over the channel, including a charge injection and extraction gate and a transfer gate.

The device may also include a shift register responsive to a charge packet under the floating gate and disposed to receive the charge packet proportional to the voltage sampled by the sample and hold circuit. Preferably the sampling circuit is a charge sample and hold circuit having an input tied to the floating gate via a switch.

Preferably the structure can define a potential well under the floating gate, with the source and structure being interactively coupled to facilitate an equilibration process occurring between those charges associated with the source and those charges associated with the well such that the remaining charges in the well are proportional to the charges on the floating gate. The equilibration process can be double-sided and can take place about the first reference barrier. Preferably the ratio between the final signal charge in the channel and the signal charge on the floating gate is 1:2.

In yet another aspect of the invention, a charge coupled device has a source of charge, a charge sample and hold circuit defining a potential well thereunder, a charge injection and extraction phase, a reference electrode, and the source providing a charge to be held under influence of the sample and hold circuit in the potential well thereunder, the injection and extraction phase causing the source charge to be injected into and extracted out of that potential well so as to leave a charge in that well representative of the charge in the sample and hold circuit. Preferably the charge sample and hold circuit has an input tied to a floating gate via a switch, the reference electrode tied to the input of the switch via a resistor. The switch may be a MOSFET, a pair of MOSFETS, a diode bridge, a MESFET, or an optoelectronic switch. The reference electrode preferably sets a DC bias level to provide a zero reference point for the voltage applied to the floating gate. A transfer phase can be provided whereby the charge in the potential well can be transferred to a shift register.

Preferably the device has a p-type substrate, an n-type charge source, an n-type charge drain, and an n-type layer in the substrate, with a buried channel defined therein, the n-type layer interposed between the source and drain, and at least the floating gate defined over the channel. Several gates may be defined over the channel, including a charge injection and extraction gate and a transfer gate. Preferably the potential well is defined under the floating gate, the source interactive with the floating gate to facilitate an equilibration process to occur between those charges associated with the source and those charges associated with the well such that the remaining charges in the well are proportional to the charges on the floating gate. Preferably the ratio between the final signal charge in the channel and the signal charge on the floating gate is 1:2.

DESCRIPTION OF THE PREFERRED EMBODIMENTS

First we briefly describe the drawings.

FIGS. 9A-9D are potential diagrams of the floating gates CCD device of FIG. 8 for x t=1, 1 t=2, and t=3, respectively.

FIG. 10 is a timing diagram for the device of FIG. 8.

Figure 1:
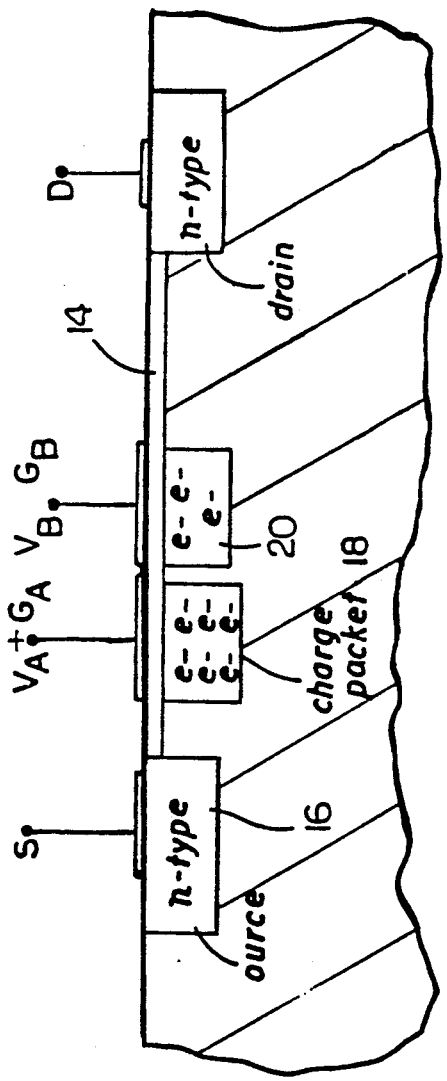
FIG. 1 is a cross-sectional view of a surface, n-channel CCD device.

Referring to FIG. 1, a typical surface n-channel charge coupled device 10 is shown in cross-section having a p-type silicon substrate 12 coated with an insulating thin film 14, for example, 670 Å of silicon dioxide. This $SiO_2$ layer is in turn coated at selected positions with a conductive layer of, for example, doped amorphous polysilicon, to form gates $G_A$ and $G_B$. Source S and drain D can be formed by ion implantation into the substrate. A region of n-doped silicon 16 provides a source of charge, in this case, electrons, and is controlled through the application of voltage to the source diffusion. Application of a voltage $V_A$ to gate $G_A$ which is relatively positive with respect to the potential of the source region 16 creates a region of lower potential energy in the silicon substrate 12 adjacent to gate $G_A$. This lower potential region attracts the higher potential charges from the source 16 to a position under gate $G_A$, thereby creating a charge packet 18.

Charge packet 18 can be manipulated between adjacent gates by judiciously charging and discharging the gates. For example, the charge packet under gate $G_A$ may be moved to form a new packet 20 under gate $G_B$ by reducing the voltage level at gate $G_A$ to less than that at gate $G_B$. Thus the charges in the packet 18 under gate $G_A$ will be attracted to the more positive potential under gate $G_B$ to form a new packet 20 under $G_B$ gate.

Figure 2:
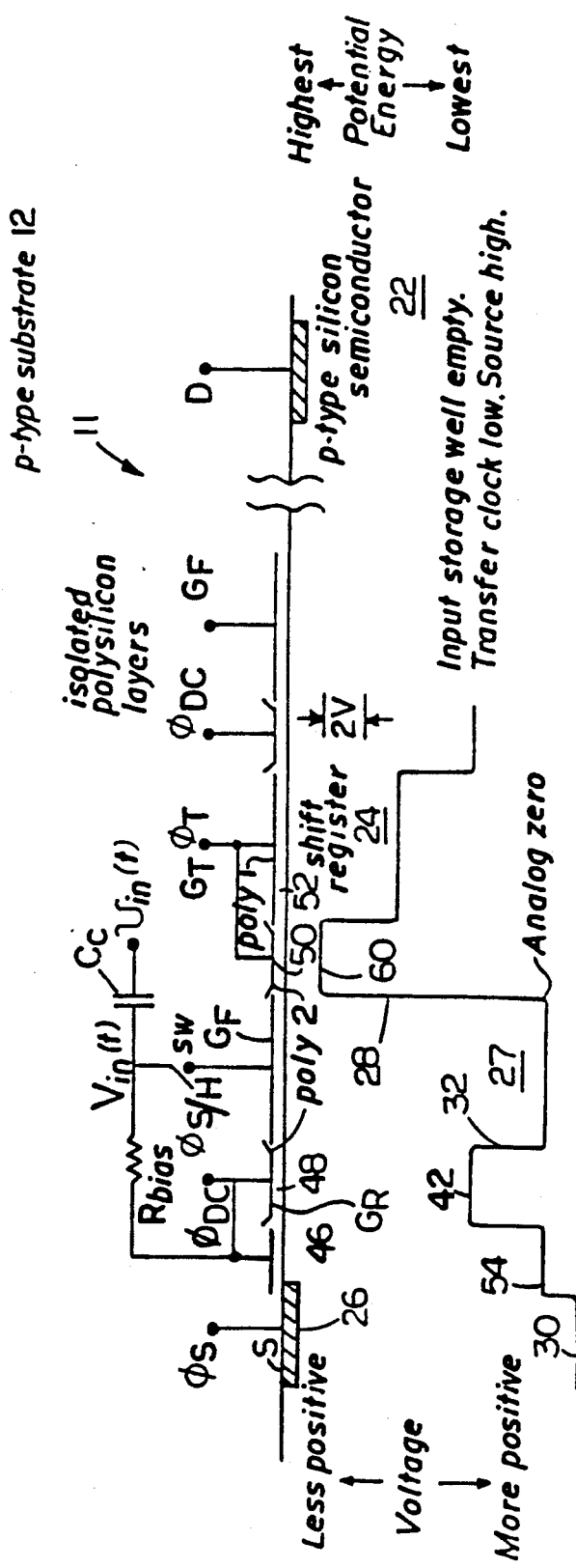
FIG. 2 is an embodiment of the floating gate CCD invention and the potential diagram of the device prior to sampling a voltage signal.

Referring now to FIG. 2, one embodiment of the present floating-gate charge-balance CCD invention in schematic representation, with the charge potential diagram for this configuration prior to sampling a voltage signal, is shown. Charge potential diagrams are commonly used to describe CCD operation. The potential in the channel under each gate in the device is indicated by the respective position of the curve located directly under that gate. The lowest potential energy is at the bottom of a curve. Hence, for the case of an n-channel device (charge carriers are electrons) as shown in FIG. 2, the lower the curve (the lower the potential energy) the more positive the voltage. The charge carriers thus will migrate to the lowest potential available analogous to water flowing to the bottom of a well.

In FIG. 2, an embodiment of our charge-coupled device 11 is shown having a p-type silicon substrate 22 and a series of functional gates, including a floating gate $G_F$, a reference gate $G_R$, a transfer gate $G_T$, and source S.

The voltage of the floating gate $G_F$ is controlled by the clock waveform $\phi_{S/H}$; the reference gate $G_R$ is held at a fixed reference bias voltage using the constant-voltage waveform $100\ DC$; and the transfer gate $G_T$, which forms the beginning of a CCD shift register 24, is controlled by voltage waveform $\phi_T$. A source of charge, in this case electrons, is provided in the form of an n-doped region 26 on the p-type substrate 22 and is controlled by voltage waveform $\phi_S$ applied through source S. The charge-injection structure described above is rather simplistic and it will be understood by those skilled in the art that other and more elegant designs may be employed without departing from the spirit and scope of the present invention.

The floating gate $G_F$ is coupled to the reference gate $G_R$ through a bias resistor $R_{bias}$ and to the signal voltage $V_{in}$ which is capacitively coupled through capacitor C. The switch SW is pulsed on and off according to the waveform $\phi_{S/H}$. The switch in practice may be a MOSFET in MOS technology, or a pair of complementary MOSFETS (CMOS), a diode bridge, MESFET, opto-electronic switch, or any other suitable switching system.

The charge potential diagram in FIG. 2 illustrates the condition of the floating gate CCD input device 11 prior to sampling the signal voltage $V_{in}(t)$. The very positive source potential $\phi_S$ provides the lowest local potential for mobile electrons, while the storage well 27 under the floating gate $G_F$ is empty of charge. The transfer clock voltage $\phi_T$ is low. It is assumed here that the floating gate has been precharged to $\phi_{DC}$ (the analog zero potential level). Under these conditions, the transfer clock electrode establishes under gate $G_T$ a high potential barrier 28 to charges at the front end of the CCD shift register.

A potential well 27 is thus produced under the floating gate $G_F$ with the right wall 28 of the well being formed by the lower voltage potential 60 under the transfer gate $G_T$ and the left wall 32 of the well being formed by a higher potential barrier 42 under the $\phi_{DC}$ electrode 48.

The procedure for sampling the voltage signal $V_{in}(t)$, according to the embodiment of FIG. 2, is as follows: First, the analog coupling switch SW closes under control of the $\phi_{S/H}$ clock, allowing a signal charge sample of input signal $V_{in}(t)$ to flow onto the floating gate $G_F$, which thus affects the depth of well 27. The coupling switch is next pulsed open, thereby isolating or floating the floating gate $G_F$ which remains at the potential imposed during the gate closed period. Next, with the floating gate remaining isolated, the source potential $\phi_S$ is pulsed negative, which allows charges from the source 26 to flow into well 27. Thereafter, source potential $\phi_S$ pulsed positive to extract excess charge from well 27 down to the level of barrier 42. As a result, a charge packet, representative of the signal sample, will be stored in the floating gate well 27 and will be available for transfer to the CCD shift register, by operation of the transfer gate $G_T$.

Figure 3:
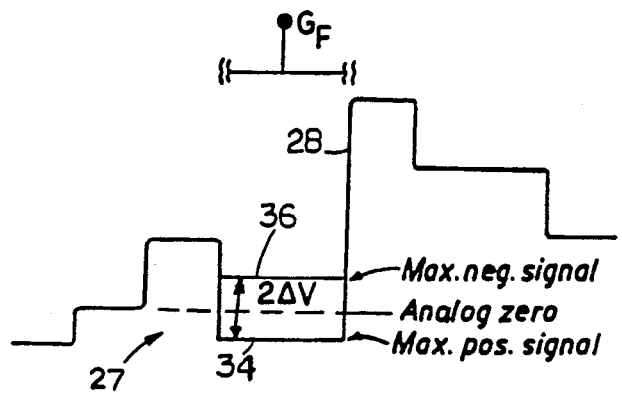
FIG. 3 is a potential diagram of the floating gate CCD device of FIG. 2 immediately after sampling a voltage signal.

Referring now to FIG. 3, a second potential diagram shows the step in which sampling the signal takes place. The analog switch SW, under control of the $\phi_{S/H}$ clock, first closes to take a sample of the input signal $V_{in}(t)$, creating a proportional charge upon the floating gate electrode $G_F$, and then opens. With the analog switch open, the floating gate is effectively isolated or floating.

It will now be appreciated that an important advantage of the present invention arises from isolating the floating gate. When the sampling switch is closed, an amount of charge proportional to the signal flows onto the floating gate. When the switch opens the "amount" of signal charge does not change (except through undesirable leakage) even though the voltage can change due to changes in charge in the channel beneath the floating gate. Thus the analog switch/floating gate electrode combination forms a charge (as opposed to voltage) sample-and-hold circuit for isolating the signal sample. The signal sample, at this point in the form of an adjusted empty-well depth, is isolated from outside electrical disturbance (including the effects of preceding signal samples and subsequent input signal changes).

It will now be understood, therefore, that charge is injected under gate $G_F$ from the n-type source by pulsing $\phi_S$ negative. The charge (electrons) thus will flow from the source into well 27. By virtue of the floating gate being isolated, the electrical field of the charges so introduced into the well interacts with the field of the charge on the floating gate as introduced during the switch closed period. Thus, depth of well 27 beneath the gate is affected by the change of potential on the gate. The amount of charge on the isolated floating gate $G_F$, however, remains unchanged.

The potential diagram of FIG. 3 shows the empty-well potential beneath the floating gate for the two extremes of a positive 34 and a negative 36 signal sample applied t the gate by pulsing the switch SW closed, then open, with an appropriately applied $V_{in}$. In this case, the channel potential may change $\pm\Delta V$ (for a total swing of $2\Delta V$) from its zero level of the $\phi_{DC}$ reference on the floating gate. This implies that the signal voltage swing on the floating gate itself is $2\Delta V/k$ maximum, where k is the voltage transfer function between the floating gate and the depleted channel.

Figure 4:
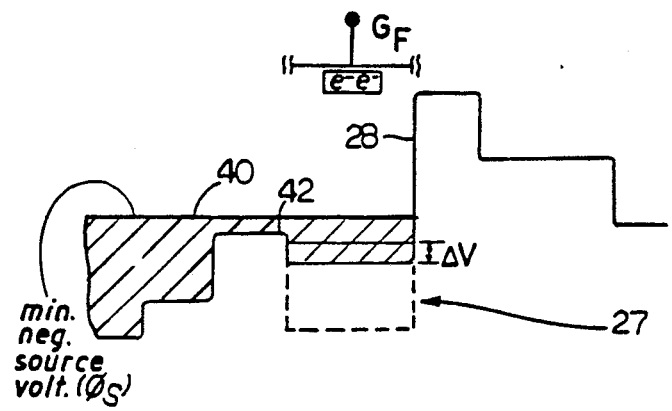
FIG. 4 is a potential diagram of the floating gate CCD device of FIG. 2 after injecting charge by pulsing the source voltage to a maximum allowed value.

If the charge sample on the $G_F$ gate is positive (i.e., a positive signal sample), the field of this charge combines with the field of the negative charge from the source to reduce the well 27 depth, i.e. it becomes more negative, as shown in FIG. 4. If the charge sample on the $G_F$ gate is negative, (i.e., a negative signal sample) the field of this charge combines with the field of the negative charge in the well and thereby reduces well depth, as shown in FIG. 5, to less than in the positive signal sample case of FIG. 4.

This change in well depth in response to introduction or removal of charge gives rise to another important advantage of the present invention. After the negative source pulse, charge quantity in the well may equilibrate by two mechanisms: first, flow of this charge back to the source, and second, the adjustment of the well depth, the latter increasing as excess charge is extracted.

Another property of this well depth adjustment, is that the source voltage may operate over a sizeable range without affecting the relationship between the final quantity of charge under the gate and the amplitude of the signal sample voltage. An advantage of the present technique is thus the insensitivity of the sampling method to variations of the source voltage magnitude due to the wide range of voltages allowable, thereby eliminating any application or process dependent adjustment.

Figure 5:
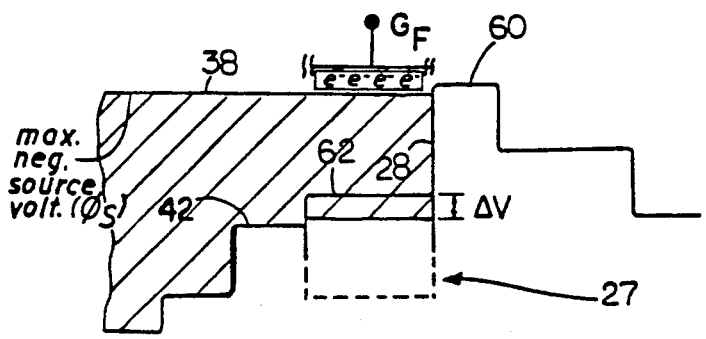
FIG. 5 is a potential diagram of the floating gate CCD device of FIG. 2 after injecting charge by pulsing the source voltage to a minimum allowed value.

The two cases of negative source potential shown in FIGS. 4 and 5 bracket the possible range of minimum source voltages. In FIG. 4 source voltage is just negative enough to safely inject charge (level 40) over the first barrier 42 and into the floating gate well 27. In FIG. 5, the source voltage level 38 is as negative as it can be (with an appropriate safety margin) without injecting charge over the $G_T$ barrier 60. Regardless of the source voltage, within a wide range, the final quantity of charge in the well will be the same independent of the source negative voltage range.

As charge is injected under the floating gate, gate voltage decreases as the field effect of the negative charges interact with those on the floating gate electrode. For a maximum negative source voltage pulse as in FIG. 5, the floating gate $G_F$ voltage can even decrease to the point that the storage well 27 is collapsed completely. The well, however, will reform as excess charge is removed.

An important feature of the invention is that charge residing in the channel under the floating gate decreases the floating gate voltage and therefore decreases the storage well depth. This negative feedback can be made to compress the original empty-well $2\Delta V$ voltage swing (FIG. 3) in relation to the signal amplitude in the channel due to the signal to some lower voltage swing, preferably, $\Delta V$ when the final signal-charge packet resides in the storage well. Note also that the signal $\Delta V$ (in both FIGS. 4 and 5) in the channel is independent of negative source potential for the two extreme cases shown, although the $\Delta V$ for the two cases is offset during charge injection. This offset will vanish when the excess charge is removed from the storage well (e.g., the source S is pulsed positive).

Figure 6:
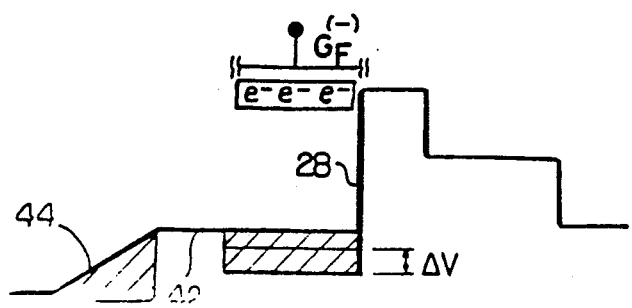
FIG. 6 is a potential diagram of the floating gate CCD device of FIG. 2 after removal of excess charge.

Turning now to FIG. 6, this potential diagram shows the excess charge 44 which had been under the floating gate having been removed by bringing the source diffusion high (i.e., source voltage pulsed high). As excess charge 44 is extracted from under gate $G_F$, the floating gate voltage now rises, thereby resulting in a deeper storage well 27. This feedback phenomenon has two desirable consequences. First, not all of the excess charge under the floating gate $G_F$ has to be removed to the source; some is required to fill the deepening storage well. Second, the fact that both the source and storage well are simultaneously going positive results in double-sided equilibration about the first reference barrier 42. This double-sided equilibration results in faster settling to final value than if all excess charge had to return to the source.

After equilibration, the final quantity of signal charge in the storage well is independent of the $\phi_S$ negative value (within the extreme limits shown in FIGS. 4 and 5). There is a balance between the final signal charge in the channel and the original signal charge on the floating gate, with the feedback factor determining the ratio. It will therefore be appreciated that this feedback factor can be controlled to advantage. For example, by setting the factor to 0.5 an analog-zero input will produce a half-full well of charge (called a "fat zero"), which is desirable in order to be able to accommodate bipolar input signals. Well-depth variations due to processing are no longer a major problem because an analog-zero input signal still produces a half-full well of charge as long as the feedback factor is stable.

This automatic adjustment of the reference charge packet size to the well depth is a feature not seen in any other known input technique. Also, no separate bias voltage must be supplied (or adjusted) to achieve proper "half-full well" operation. (Furthermore, it should be noted that the amount of $\Delta V$ shown in FIGS. 4, 5 and 6, and the height of barrier 42, is the same in each case, although the drawings may not be to scale.)

Figure 7:
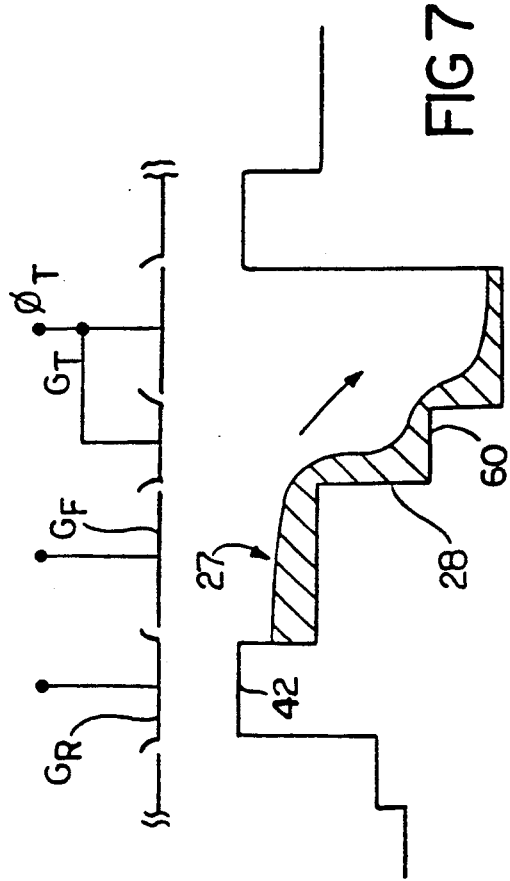
FIG. 7 illustrates the potential diagram of the floating gate CCD device of FIG. 2 during transfer of a charge packet into a CCD shift register.
Figure 8:
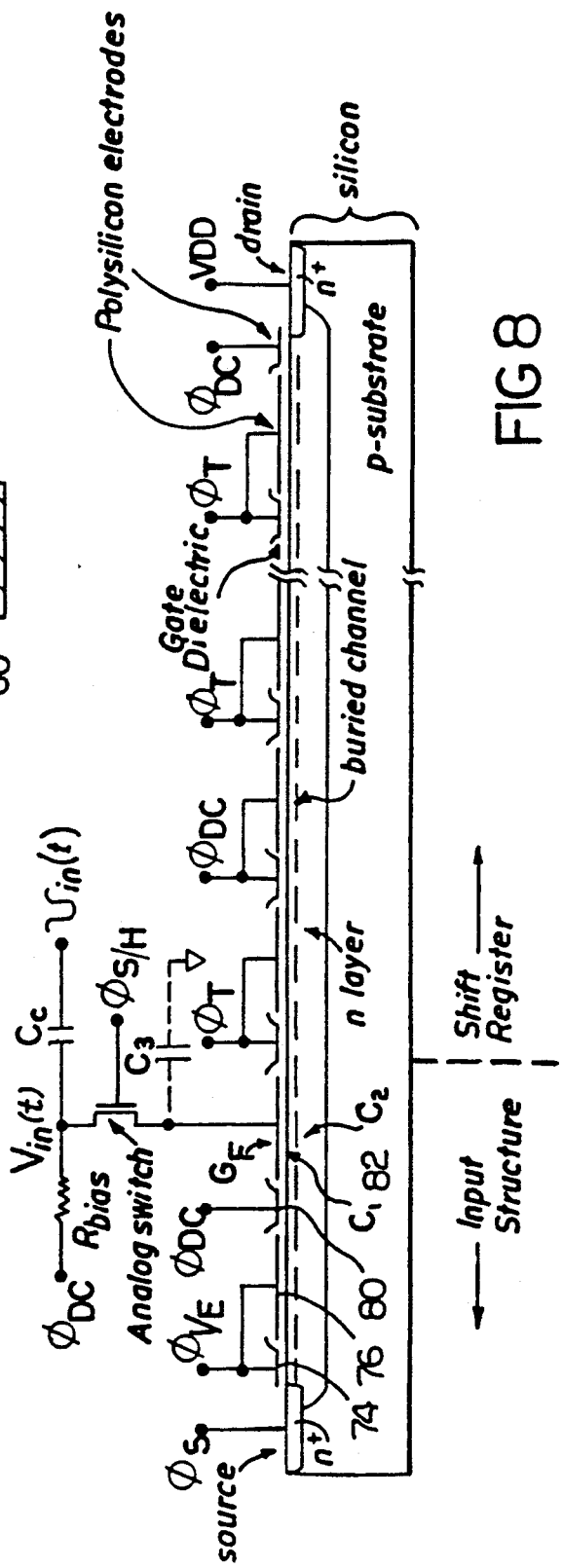
FIG. 8 is a schematic drawing of a preferred n-buried channel floating-gate, charge-balance input CCD.

In the diagram shown in FIG. 7, the $\phi_T$ clock goes high with respect to $\phi_{DC}$, thus lowering the barrier height 60 to allow the charge packet under the floating gate to transfer into the CCD shift register. This action completes one cycle of operation.

Differing potential regions under a single phase (dual gate), such as shown in the case of the $\phi_{DC}$ phase at gates 46 and 48 and $\phi_T$ phase at gates 50 and 52 in FIG. 2, may be formed by selective doping of the silicon substrate beneath the gates. Addition of a negatively charged dopant to form a poly 2 gate (e.g., sections 48, or 50) increases the potential for electrons and increases the well depth thereunder The preceding description of the floating-gate charge-balance input technique employs the specific examples which should not be construed as limiting the invention. While the more simple case of a surface n-channel CCD using uniphase clocking is shown, the technique is equally applicable to buried-channel, p-channel, or devices using multiphase clocking, for example. Any semiconductor material capable of supporting CCD operation may be used. Further, the examples of device dimensions and well depths discussed herein, while typical of many CCD designs, are mere examples and in no way represent limitations.

Referring now to FIGS. 8, 9A-9D and 10, a preferred embodiment of an n-buried channel floating gate CCD input device is described, where:

| | |
|---|---|
| $C_c$ | Input coupling capacitor, |
| $C_1$ | Capacitance between floating gate and buried channel, |
| $C_2$ | Depletion capacitance between buried channel and substrate, |
| $C_3$ | Stray capacitance on the floating gate, |
| D | Drain, |
| $G_F$ | Floating gate, |
| k | Voltage transfer function between floating gate and depleted buried channel, |
| $Q_{sig}$ | Signal charge |
| $Q_W$ | Storage well charge, |
| $R_{bias}$ | Input bias resistor, |
| S | Source, |
| t | Time, |
| $V_{GF}$ | Floating gate voltage, |
| $V_{in}(t)$ | Time-varying input voltage, centered about ground, |
| $V_{in}(t)$ | Level-shifted version of the input signal (centered about $\phi_{DC}$) which is sampled by the analog switch, |
| $V_{DD}$ | DC voltage applied to the drain diffusion, |
| $V_W$ | Empty storage well depth, |
| $\phi_{DC}$ | Fixed voltage applied to reference electrodes in a CCD using uniphase |

|        | -continued                                                                                   |
|--------|----------------------------------------------------------------------------------------------|
| $\phi_{I/E}$ | clocking, Clock waveform which effects charge Injection and Extraction at CCD input, |
| $\phi_S$ | Clock waveform controlling the source potential, |
| $\phi_{S/H}$ | Clock waveform controlling an analog switch used to sample a signal, |
| $\phi_T$ | CCD transfer clock (effects charge transfer), and |
| $\Delta V$ | Change in buried channel potential. |

A preferred technique of injecting and extracting charge at the CCD input is shown in FIGS. 8 and 9A-9D, with the timing diagram shown in FIG. 10. The first electrode gate pair 74, 76 is designed to have the same gate length, width, and charge storage capacity (well depth) as the remaining electrode pairs. The source is held at a high dc voltage, and the analog switch SW has moved a sample $V_{in}(t)$ onto the $G_F$ gate 82 and is now open.

At t=1, well 70 under the floating gate is empty, barrier 72 has been established under the first $\phi_T$ barrier electrode 68, and a high $\phi_{I/E}$ voltage has attempted to make the potential under the first electrode gate pair 74, 76 lower than the potential of source S. Consequently, charge rushes in from the source and floods the buried channel 78 up to the first $\phi_{DC}$ electrode 80 (and barrier 84 established thereunder).

At t=2, the $\phi_{I/E}$ clock has pulsed low (relative to the source) and caused the first pair of electrodes to hold a filled well of charge from the source (any excess spills back to the source as the potential under the first barrier electrode rises past that of the source). As the potential under the first pair of electrodes 74, 76 continues to rise it eventually exceeds that under the first $\phi_{DC}$ electrode 80, and the charge of the full well 78 is dumped into well 70 under the lower potential (higher voltage) $\phi_{DC}$ SCM electrode pair (past the now relatively lower barrier 84 up to barrier 72).

At t=3, the $\phi_{I/E}$ clock pulses high, extracting excess charge from under the $G_F$ electrode as the potential under the $\phi_{I/E}$ storage electrode becomes lower than that under the $\phi_{DC}$ barrier electrode. As the $\phi I/E$ clock reaches its maximum positive voltage the electrodes 74, 76 which it controls will again have buried channels (wells) which are flooded with charge from the source. After a suitable equilibration time the charge packet 86 under the floating gate will be proportional to the signal sample o the floating gate. At this point packet 86 can be transferred (although not shown) into the CCD shift register section by raising the $\phi_T$ clock to a relatively high positive voltage (lowering barrier 72).

Analysis

Figure 11:
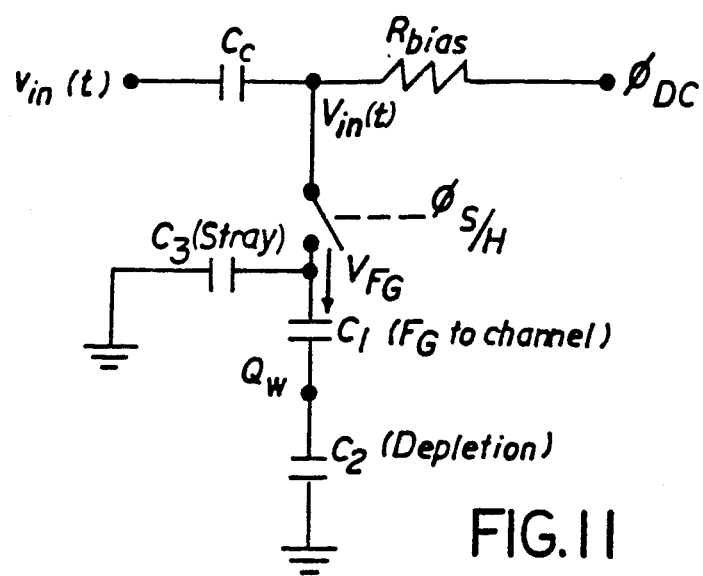
FIG. 11 is a schematic drawing of an equivalent circuit of the floating-gate charge-balance input of the invention.

The following simplified analysis, made with reference to the equivalent circuit of the floating-gate charge-balance input shown in FIG. 11, may be useful in application of the present invention. (It will be appreciated that $C_a S C_b$ is defined to be $C_a$ in series with $C_b$).

$$V_{FG} = V_{in} - \frac{Q_w}{C_2 + C_1 S C_3} \times \frac{C_1}{C_1 + C_3} \quad (1)$$

$$V_{FG} = V_{in} - \frac{Q_w}{C_2 + \frac{C_1 C_3}{C_1 + C_3}} \times \frac{C_1}{C_1 + C_3}$$

$$= V_{in} - \frac{Q_w/C_3}{C_2/C_3 + \frac{C_1}{C_1 + C_3}} \times \frac{C_1}{C_1 + C_3}$$

Let $C_1/(C_1 + C_3) = a$, $$\text{Then } V_{FG} = V_{in} - \frac{a Q_w / C_3}{C_2/C_3 + a} \quad (2)$$

$$Q_w = C_1 [V_w + k(V_{FG} - \phi_{DC})],$$
Using (2)

$$Q_w = C_1 \left[ V_w + k \left( V_{in} - \frac{a Q_w / C_3}{C_2/C_3 + a} - \phi_{DC} \right) \right]$$

$$\rightarrow Q_w \left[ 1 + \frac{k a\, C_1/C_3}{C_2/C_3 + a} \right] = C_1 [V_w + k(V_{in} - \phi_{DC})]$$

$$\rightarrow Q_w = \frac{C_1}{1 + \frac{k a C_1}{C_2 + a C_3}} [V_w + k(V_{in} - \phi_{DC})]$$

$$\rightarrow Q_w = \frac{C_1}{1 + \frac{k C_1^2}{C_1 C_2 + C_2 C_3 + C_1 C_3}} [V_w + k(V_{in} - \phi_{DC})] \quad (3)$$

exact equation
Approximation: $C_2 (1 + C_3/C_1) \approx 2 C_2$
(The ratio $C_3/C_1 \approx 1$ is justified below.)

$$\text{Then, } Q_w \approx \frac{C_1}{1 + \frac{k C_1}{2 C_2 + C_3}} [V_w + k(V_{in} - \phi_{DC})] \quad (4)$$

Useful approximation

To adjust $Q_w$ for half-full-well amplitude under fat-zero conditions (i.e., $V_{in} = 100_{DC}$), $C_3$ must be appropriately scaled:

$$\frac{k C_1}{2 C_2 + C_3} = 1 \rightarrow C_3 = k C_1 - 2 C_2$$

Typical device values: $C_2 \approx 0.04 C_1$ (fixed ratio, independent of signal), and $k \approx 0.96$ for buried channel, therefore, $C_3 = (0.96 - 0.08) C_1$ for half-full-well fat zero. The $C_3/C_1$ ratio can be adjusted during design so that it tracks with processing variations and therefore remains relatively constant.

The robustness of floating-gate charge-balance electrical input technique is shown in the following analysis showing sensitivity of fat-zero level to the $C_3/C_1$ ratio, assuming $C_2 = 0.04 C_1$, k=0.96: Using equation (4),

|               | $C_3/C_1$ | % Full Well |              |
|---------------|-----------|-------------|--------------|
|               | 1.04      | 53.8        |              |
|               | 0.96      | 52.0        |              |
|               | 0.88      | 50.0        |              |
|               | 0.80      | 47.8        |              |
| $\Delta = \pm 36\%$ | 0.76 | 46.4        | $\Delta = \pm 16\%$ |
|               | 0.72      | 45.5        |              |
|               | 0.64      | 42.2        |              |
|               | 0.56      | 40.0        |              |

This low sensitivity to the $C_3/C_1$ ratio (which itself can be made relatively process insensitive) should result in very accurate setting of the fat-zero level over a wide range of processing variations.

Another benefit of the negative feedback inherent in this new input technique is the reduction in sensitivity of signal charge amplitude to the k factor. Using equation (4) the signal charge, which is the incremental change in $Q_w$ caused by an incremental change is in $V_{in}$;

$$Q_{sig} \approx \frac{C_1}{1 + \frac{kC_1}{2C_2 + C_3}} [k(V_{in} - \phi_{DC})]$$

$$= \frac{C_1}{\frac{C_1}{2C_2 + C_3} + \frac{1}{k}} (V_{in} - \phi_{DC})$$

For $C_3/C_1 = 0.88$ (rat zero = half full well), and $C_2 = 0.04\ C_1$, the $Q_{sig}$ signal charge level is proportional to:

$$Q_{sig} \propto \frac{1}{\frac{C_1}{2C_2 + C_3} + \frac{1}{k}} = \frac{k}{1 + \frac{k}{0.96}}$$

For $K \approx 0.96$ the signal variations will be about half of the variations in k due to processing.

I claim:

1. In a charge-coupled device having a charge source and a floating gate input, a method of sampling a time-vary signal voltage and converting it to an incrementally proportional charge packet, the steps comprising:
   (a) precharging the floating gate with a quantity of charge including a signal charge which is incrementally proportional to the sampled time-varying signal voltage,
   (b) isolating the floating gate such that said charge substantially remains on the floating gate,
   (c) establishing an empty potential well beneath the floating gate and raising the source to a potential higher than the well potential causing charge from the source to form as a charge packet in the well, and
   (d) lowering the source potential to extract some charge from the well, the source being interactive with the floating gate to facilitate an equilibration process to occur between the charge associated with the source and the charge associated with the well such that the remaining charge packet in the well is incrementally proportional to said signal charge on the floating gate.

2. The method of claim 1, wherein the ratio of the remaining charge packet in the well to the signal charge on the floating gate is 1:2.

3. The method of claim 2 further comprising the step of moving the remaining charge packet to a shift register.

4. In a device having a source of charge, whose potential is variable, and having at least one gate, a method for sampling a time-varying signal voltage and converting it into the form of an incrementally proportional charge packet, comprising the steps of:
   establishing an empty potential well beneath said at least one gate,
   connecting the time-varying signal voltage to the at least one gate and thereby establishing thereon a potential and a charge including a signal charge which is incrementally proportional to said time-varying signal voltage and influencing the depth of the well therebeneath,
   disconnecting the time-varying signal voltage and thereby isolating said at least one gate such that said charge substantially remains on said at least one gate,
   pulsing the potential of the source to allow charge to temporarily flow into the well, during which the gate potential and well depth are influenced, and
   returning excess charge in said well to the source during which the gate potential and well depth are influenced, the source being interactive with the at least one gate to facilitate an equilibration process to occur between the charge associated with the source and the charge associated with the well such that the remaining charge packet in the well is incrementally proportional to said signal charge on the at least one gate.

5. The method of claim 4 wherein the device is metal-oxide-semiconductor (MOS) charge-coupled device (CCD).

6. The method of claim 4, further comprising the step of moving the remaining charge to a shift register.

7. The method of claim 4, further comprising the step of: at a first time, applying a relatively high voltage to a charge injection and extraction control gate, and flooding a well under the charge injection and extraction control gate.

8. The method of claim 7, further comprising the step of:
   at a second time, pulsing the charge injection and extraction control gate low such that the charge in the well under the charge injection and control gate are transferred to the empty potential well.

9. The method of claim 8, further comprising the step of:
   at a third time, pulsing the charge injection and extraction control gate high and extracting excess charge from the empty potential well.

10. A charge-couple device, comprising:
    a circuit for sampling an input time-varying signal voltage, said sampling circuit including a floating gate, said sampling circuit being operable for connecting said input time-varying signal voltage to said floating gate so as to establish a a quantity of charge including a signal charge which is incrementally proportional to said sampled time-varying signal voltage thereon and for disconnecting said input voltage so as to isolate said floating gate such that said charge substantially remains on said floating gate.
    a source of charges, and
    a structure responsive to a voltage from the floating gate and capable of generating a charge packet which is incrementally proportional to the sampled time-varying signal voltage, the structure capable of availing the charge packet to a desired location in the device, wherein said structure defines a potential well under the floating gate, the source and structure being interactively coupled to facilitate an equilibration process to occur between those charges associated with the source and those charges associated with the well such the the remaining charge packet in the well is incrementally proportional to said signal charge on the floating gate.

11. The device of claim 10 further comprising at least one phase, a first phase comprising a barrier electrode and a first storage electrode.

12. The device of claim 11 further comprising a second phase, the first phase being for charge injection and extraction and the second phase being for charge transfer.

13. The device of claim 12, wherein the equilibration process is double-sided and takes place about the first reference barrier.

14. The device of claim 11 wherein the barrier electrode and the storage electrode comprise a charge injection and extraction electrode pair.

15. The device of claim 14 wherein one of the pair is comprised of a first conductive polysilicon layer having a potential barrier therebeneath and the other of a second conductive polysilicon layer having a potential well therebeneath.

16. The device of claim 10 wherein the floating gate comprises an electrode.

17. The device of claim 16 wherein the electrode is comprised of a first conductive polysilicon layer having a potential barrier therebeneath or a second conductive polysilicon layer having a potential well therebeneath.

18. The device of claim 10 further comprising a p-type substrate, an n-type charge source, an n-type charge drain, and an n-type layer in the substrate, with a buried channel defined therein, the n-type layer interposed between the source and drain, and at least the floating gate defined over the channel.

19. The device of claim 18 wherein several gates are defined over the channel, including a charge injection and extraction gate and a transfer gate.

20. The device of claim 10 wherein the sampling circuit is a charge sample and hold circuit comprised of an input tied to the floating gate via a switch.

21. The device of claim 20, further including a shift register responsive to said charge packet and disposed to receive the charge packet.

22. The device of claim 10 wherein the ratio between the final signal charge in the channel and the signal charge on the floating gate is 1:2.

23. The device of claim 10 comprises a metal-oxide-semiconductor charge-coupled device.

24. A charge-coupled device, comprising:
a source of charge;
an input voltage;
a charge sample and hold circuit, said sample and hold circuit including a floating gate to which said input voltage is connected so as to establish a charge on said floating gate and defining a potential well thereunder, said input voltage being disconnected from said floating gate so as to isolate said floating gate such that said charge substantially remains on said floating gate,
a charge injection and extraction phase, and
a reference electrode,
said source providing a charge to be held under influence of the sample and hold circuit in the potential well thereunder, the injection and extraction phase causing the source charge to be injected into and extracted out of the potential well so as to leave a charge in that well representative of the charge in the sample and hold circuit,
said potential well is under the floating gate, the source being interactive with the floating gate to facilitate an equilibration process to occur between the charge associated with the source and the charge associated with the well such that the remaining charge in the well is proportional to the charge on the floating gate.

25. The device of claim 24 wherein the charge sample and hold circuit comprises an input tied to said floating gate via a switch, the reference electrode tied to the input of the switch via a resistor.

26. The device of claim 25 wherein the reference electrode sets a DC bias level to provide a zero reference point for the voltage applied to the floating gate.

27. The device of claim 26 further comprising a p-type substrate, an n-type charge source, an n-type charge drain, and an n-type layer in the substrate, with a buried channel defined therein, the n-type layer interposed between the source and drain, and at least the floating gate defined over the channel.

28. The device of claim 27 wherein several gates are defined over the channel, including a charge injection and extraction gate and a transfer gate.

29. The device of claim 25 wherein the switch is a metal-oxide-semiconductor field-effect transistor (MOSFET), a pair of metal-oxide-semiconductor field-effect transistors, a diode bridge, a metal-semiconductor field-effect transistor (MESFET), or an optoelectronic switch.

30. The device of claim 24 further comprising a transfer phase whereby the charge in said potential well can be transferred to a shift register.

31. The device of claim 24 wherein the ratio between the final signal charge in the channel and the signal charge on the floating gate is 1:2.

* * * * *